US012575373B2

(12) United States Patent
Wu et al.

(10) Patent No.: US 12,575,373 B2
(45) Date of Patent: Mar. 10, 2026

(54) WAFER THINNING TAPE AND PREPARATION METHOD THEREOF, AND WAFER GRINDING METHOD

(71) Applicant: WUHAN CHOICE TECHNOLOGY CO., LTD., Wuhan (CN)

(72) Inventors: De Wu, Wuhan (CN); Zhicong Lv, Wuhan (CN); Shuhang Liao, Wuhan (CN); Junxing Su, Wuhan (CN)

(73) Assignee: WUHAN CHOICE TECHNOLOGY CO., LTD, Wuhan (CN)

( * ) Notice: Subject to any disclaimer, the term of this patent is extended or adjusted under 35 U.S.C. 154(b) by 0 days.

(21) Appl. No.: 18/948,571

(22) Filed: Nov. 15, 2024

(65) Prior Publication Data

US 2025/0112079 A1 Apr. 3, 2025

Related U.S. Application Data

(63) Continuation of application No. PCT/CN2024/088243, filed on Apr. 17, 2024.

(30) Foreign Application Priority Data

Sep. 28, 2023 (CN) ........................ 202311266169.7

(51) Int. Cl.

| | |
|---|---|
| ***C09J 7/30*** | (2018.01) |
| ***B05D 5/10*** | (2006.01) |
| ***B05D 7/20*** | (2006.01) |
| ***B32B 15/02*** | (2006.01) |
| ***B32B 37/12*** | (2006.01) |
| ***C08J 5/00*** | (2006.01) |
| ***C08K 5/00*** | (2006.01) |
| ***C08K 5/29*** | (2006.01) |
| ***C08K 5/3462*** | (2006.01) |
| ***C08K 5/435*** | (2006.01) |
| ***H01L 21/683*** | (2006.01) |

(52) U.S. Cl.

CPC ............ *H01L 21/6836* (2013.01); *B05D 5/10* (2013.01); *B05D 7/20* (2013.01); *B32B 15/02* (2013.01); *B32B 37/1284* (2013.01); *C08J 5/005* (2013.01); *C08K 5/0025* (2013.01); *C08K 5/3462* (2013.01); *C08K 5/435* (2013.01); *C09J 7/30* (2018.01); *B32B 2311/08* (2013.01); *B32B 2405/00* (2013.01); *C08K 5/0075* (2013.01); *C08K 5/29* (2013.01); *C09J 2203/326* (2013.01); *C09J 2301/122* (2020.08); *C09J 2301/314* (2020.08); *C09J 2301/408* (2020.08); *C09J 2433/00* (2013.01); *C09J 2475/006* (2013.01); *H01L 2221/68327* (2013.01)

(58) Field of Classification Search

None

See application file for complete search history.

(56) References Cited

U.S. PATENT DOCUMENTS

| | | | | |
|---|---|---|---|---|
| 5,023,129 | A | 6/1991 | Du Pont | |
| 7,608,905 | B2 * | 10/2009 | Bratkovski | H01Q 15/0006 257/466 |
| 2009/0035580 | A1 * | 2/2009 | Chino | C09J 9/02 106/287.18 |
| 2012/0202055 | A1 | 8/2012 | Kataoka et al. | |
| 2016/0118156 | A1 * | 4/2016 | Kawaguchi | C08L 1/284 252/514 |

FOREIGN PATENT DOCUMENTS

| | | | |
|---|---|---|---|
| CN | 109265643 | A | 1/2019 |
| CN | 210765104 | U | 6/2020 |
| CN | 211170549 | U | 8/2020 |
| CN | 112574683 | A | 3/2021 |
| CN | 116285733 | A | 6/2023 |
| CN | 116487601 | A | 7/2023 |
| CN | 219526529 | U | 8/2023 |
| CN | 116769408 | A | 9/2023 |
| CN | 116769409 | A | 9/2023 |
| CN | 116987454 | A | 11/2023 |
| JP | 2005206776 | A | 8/2005 |
| JP | 2007169377 | A | 7/2007 |
| JP | 2017014407 | A | 1/2017 |
| JP | 2017039859 | A | 2/2017 |
| JP | 2019064739 | A | 4/2019 |
| JP | 2023133232 | A * | 9/2023 |

(Continued)

OTHER PUBLICATIONS

Machine translation of JP 2023133232 A (Year: 2023).*

Shengchi Bai, et al., Corrigendum: Preparation of smooth, flexible and stable silver nanowires-polyurethane composite transparent conductive films by transfer method (2018 Mater. Res. Express 5 026406), Mater. Res. Express, 2018, 059501.

Xia Yong, et al., Preparation and properties of nano silver/ polyurethane composite film based on electrospinning, 2022, pp. 54-57.

Wei Chao, et al., Development of Three-layer Transparent Wear-resistant Polyurethane Antistatic Coating on Methyl-methacrylate Surface, Experimental Research and Application, 2019, pp. 1-3.

*Primary Examiner* — Frank D Ducheneaux

(57) ABSTRACT

A wafer thinning tape and a preparation method thereof, and a wafer grinding method are provided. The wafer thinning tape includes a tape layer, a base film layer, and a conductive coating that are successively stacked, where the base film layer and the conductive coating constitute an antistatic base film; the raw materials of the tape layer include acrylic adhesive, curing agent, and antistatic agent, and the mass dosage of curing agent is 3%-4% that of the acrylic adhesive, and the mass dosage of antistatic agent is 1%-2% that of the acrylic adhesive; the base film layer is TPU film; the conductive coating is silver nanowire coating. The wafer thinning tape can be applied to wafer grinding, has excellent antistatic property, and can effectively inhibit the peeling static electricity; at the same time, it also has the advantages of peeling without residue and preventing water penetration.

15 Claims, No Drawings

(56) References Cited

FOREIGN PATENT DOCUMENTS

| | | | |
|---|---|---|---|
| KR | 20120098140 | A | 9/2012 |
| TW | 201800529 | A | 1/2018 |

* cited by examiner

WAFER THINNING TAPE AND PREPARATION METHOD THEREOF, AND WAFER GRINDING METHOD

CROSS REFERENCE TO THE RELATED APPLICATIONS

This application is a continuation application of International Application No. PCT/CN2024/088243, filed on Apr. 17, 2024, which is based upon and claims priority to Chinese Patent Application No. 202311266169.7, filed on Sep. 28, 2023, the entire contents of which are incorporated herein by reference.

TECHNICAL FIELD

The present application relates to the technical field of semiconductor wafer processing, in particular to a wafer thinning tape and a preparation method thereof, and a wafer grinding method.

BACKGROUND

In the wafer grinding process, in order to protect the structure of the copper column and tin ball on the non-grinding surface of the wafer, wafer thinning tape is generally attached to the non-grinding surface of the wafer. Wafer thinning tape provides adequate protection for wafers while also having a cushioning effect to mitigate vibration during grinding. After grinding the wafer, the wafer thinning tape needs to be removed from the wafer surface, and the peeling static electricity will be generated at this time, which will affect the wafer performance. Therefore, a wafer thinning tape that can inhibit the peeling static electricity is needed.

SUMMARY

The purpose of the present application is to provide a wafer thinning tape and a method preparation method thereof, and a wafer grinding method. The wafer thinning tape can significantly inhibit the peeling static electricity.

To achieve the above purpose, the examples of the present application provide, on the one hand, a wafer thinning tape, which includes a tape layer, a base film layer, and a conductive coating that are successively stacked, and the base film layer and the conductive coating constitute an antistatic base film; where the raw materials of the tape layer include an acrylic adhesive, a curing agent, and an antistatic agent; the mass dosage of the curing agent is 3%-4% that of the acrylic adhesive, and the mass dosage of the antistatic agent is 1%-2% that of the acrylic adhesive; the base film layer is thermoplastic polyurethane (TPU) film; and the conductive coating is a silver nanowire coating.

The curing agent is selected from a curing agent suitable for the acrylic adhesive; the TPU film is a thermoplastic polyurethane film; the silver nanowire is one-dimensional metal silver; and the base film layer and the conductive coating constitute electrostatic discharge (ESD) TPU film.

In some specific embodiments, the thickness of the tape layer is 10-50 microns.

In some specific embodiments, the thickness of the base film layer is 100-500 microns.

In some specific embodiments, the impedance of the antistatic base film is preferably not greater than $10^2$ ohm/sq; the impedance of the antistatic base film is affected by the thickness of the conductive coating, and the impedance can be adjusted by adjusting the thickness of the conductive coating.

In some specific embodiments, the curing agent is preferred toluene diisocyanate.

In some specific embodiments, the antistatic agent is preferred pyridinium, alkyl-alkyl-, salt with polyhalogeno-[(polyhalogenoalkyl)sulfonyl]alkanesulfonamide.

In some specific embodiments, the silver nanowire used in the silver nanowire coating is preferred to be 25-300 nanometers in diameter and 10-300 microns in length.

The examples of the present application provide, on the other hand, a preparation method for the wafer thinning tape. The preparation method adopts a coating process, including:

- mixing the acrylic adhesive, the curing agent, and the antistatic agent according to parts by mass to obtain a tape layer slurry;
- coating the tape layer slurry on a release film, and drying to form a tape layer on the release film;
- coating silver nanowires on one side of a base film layer, and drying to form a conductive coating on the surface of the base film layer; and
- affixing the tape layer to the other side of the base film layer to obtain the wafer thinning tape.

In some specific embodiments, the coating of tape layer slurry and the coating of silver nanowire are completed by a film coating machine.

In addition, the examples of the present application provide a wafer grinding method, which includes: first affixing the tape layer of the wafer thinning tape to the non-grinding surface of the wafer, and then grinding the wafer.

During wafer grinding, the wafer thinning tape of the present application is affixed to the non-grinding surface of the wafer to protect the non-grinding surface, and the wafer thinning tape also controls the grinding thickness uniformity and has a stress buffer effect.

Compared with the prior art, the application also has the following characteristics and beneficial effects:

The wafer thinning tape of the present application has excellent antistatic property and can effectively inhibit the peeling static electricity; at the same time, it also has the advantages of peeling without residue and preventing water penetration.

DETAILED DESCRIPTION OF THE EMBODIMENTS

In order to make the purpose, technical scheme, and beneficial effects of this application clearer, the application is further explained in detail in conjunction with examples below.

Several examples are provided below. The raw materials used in the examples are as follows:

- Acrylic adhesive: NANPAO resin TP-911, solid content 40±1%;
- Curing agent: component toluene 2,4-diisocyanate, its structural formula is

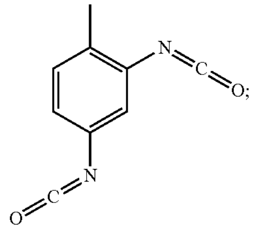

Antistatic agent: IL-P series antistatic agent can be selected; in this example, IL-P14 in IL-P series antistatic agent is selected, manufacturer: Koei Chemical Co., Ltd; main component: pyridinium, alkyl-alkyl-, salt with polyhalogeno-[(polyhalogenoalkyl)sulfonyl] alkanesulfonamide;

TPU film: commercially available, thickness 150 microns, film surface impedance $2\times10^{13}$ ohm/sq;

Silver nanowire: Asiatic Fiber Corporation FN03; the average length of silver nanowire is 5-20 microns, the average diameter is 45 nanometers, and the solid content is 1%-10%.

The components and dosage of the examples in this application are shown in Tables 1-3. The tape obtained in each example in Tables 1-3 underwent performance testing as follows:

Test of adhesion: test adhesion according to ASTM D3330;

Test of impedance: test the film surface impedance of TPU film and the surface impedance of the tape layer according to ASTM D257;

Test of peeling static electricity: the tape layer of the tape is affixed to the wafer, and the tape is peeled from the wafer at a peeling angle of 180° and a peeling speed of 1000 mm/min. The maximum electrostatic voltage generated at the moment of peeling is measured by the static meter fixed above the wafer, that is, peeling electrostatic voltage.

Test of water permeability: the tape layer is affixed to the wafer, the wafer is soaked in water at 40° C. for 1 h, then the wafer is taken out to observe whether water permeates between the tape and the wafer.

TABLE 1

Formula and performance parameters of tape layers without antistatic agent

| Number | 1-1 | 1-2 | 1-3 | 1-4 | 1-5 | 1-6 |
|---|---|---|---|---|---|---|
| Acrylic adhesive | 100 g | 100 g | 100 g | 100 g | 100 g | 100 g |
| Curing agent | 1 g | 2 g | 3 g | 4 g | 5 g | 6 g |
| Adhesion | 800 g/25 mm | 600 g/25 mm | 350 g/25 mm | 150 g/25 mm | 80 g/25 mm | 30 g/25 mm |
| Whether there is residue | NG | NG | OK | OK | OK | OK |
| Whether there is water penetration | OK | OK | OK | OK | NG | NG |

According to the formulas provided in Table 1, the acrylic adhesive and curing agent are mixed according to parts by mass to obtain slurry, and the slurry is coated on the release film by a film coating machine. After drying, a tape layer with a thickness of 20 microns is formed on the release film, and the tape layer is affixed to the wafer to test the adhesion and permeability of the tape layer and the residual condition when the tape layer is peeled off. The performance parameter data are listed in Table 1. As can be seen from the performance parameters in Table 1, the adhesion of acrylic adhesive is about 1000 g/25 mm, and the addition of curing agent will affect the adhesion, residual condition, and water permeability of acrylic adhesive. Only when the mass dosage of curing agent is 3%-4% that of the acrylic adhesive, preferably 3% that of the acrylic adhesive, can the tape layer have excellent protection against water permeation and peel without residue under the premise of ensuring good adhesion.

TABLE 2

Formula and performance parameters of tapes without conductive coating

| Number | 2-1 | 2-2 | 2-3 | 2-4 | 2-5 |
|---|---|---|---|---|---|
| Acrylic adhesive | 100 g | 100 g | 100 g | 100 g | 100 g |
| Curing agent | 3 g | 3 g | 3 g | 3 g | 3 g |
| Antistatic agent | 0 | 0.5 g | 1 g | 2 g | 5 g |
| TPU film | | | $2\times10^{13}$ ohm/sq | | |
| Adhesion | 350 g/25 mm | 320 g/25 mm | 280 g/25 mm | 270 g/25 mm | 230 g/25 mm |
| Surface impedance | $2\times10^{13}$ Ω | $3\times10^{11}$ Ω | $1\times10^{10}$ Ω | $8\times10^{9}$ Ω | $6\times10^{9}$ Ω |
| Whether there is residue | OK | OK | OK | OK | NG |
| Peeling static electricity | 3.5 kv | 0.8 kv | 0.4 kv | 0.4 kv | 0.3 kv |

According to the formulas provided in Table 2, the acrylic adhesive, curing agent, and antistatic agent are mixed according to parts by mass to obtain slurry. The slurry is coated on the release film by a film coating machine. After drying, a tape layer with a thickness of 20 microns is formed on the release film, and the surface impedance of the tape layer is tested. The tape layer is affixed to the surface of TPU film to obtain the tape without conductive coating. The tape layer of the obtained tape is affixed to the wafer, and the adhesion of the tape, the residual condition of the tape layer, and the peeling electrostatic voltage when the tape layer is removed are tested. To avoid the influence of the environment on the peeling static electricity test results, the peeling static electricity is tested at the ambient temperature of 25° C. and the ambient humidity of 50% relative humidity (RH). The performance parameters are listed in Table 2. As can be seen from Table 2, the addition of an antistatic agent can reduce the peeling static electricity, but excessive dosage will affect the adhesion and peeling residue. Only when the mass dosage of antistatic agent is 0.5%-2% that of acrylic adhesive, preferably 1%-2% that of the acrylic adhesive, can the tape layer have good adhesion and peel without residue under the premise of good antistatic property.

According to the formulas provided in Table 3, the acrylic adhesive, curing agent, and antistatic agent are mixed according to parts by mass to obtain slurry. The slurry is coated on the release film by a film coating machine. After drying, a tape layer with a thickness of 20 microns is formed on the release film. One side of the base film layer is coated with silver nanowire, and the conductive coating is formed on the base film layer after drying; that is, the ESD TPU film is obtained, and the ESD TPU film is the antistatic base film, and the film surface impedance of the ESD TPU film is measured. The tape layer is affixed to the other side of the base film layer to obtain a wafer thinning tape. The tape layer of the obtained tape is affixed to the wafer, and the residual condition and the peeling electrostatic voltage when the tape layer is removed are tested. In order to avoid the influence of the environment on the peeling electrostatic test results, the peeling static electricity is tested at the ambient temperature of 25° C. and the ambient humidity of 50% RH. The performance parameter data are listed in Table 3.

TABLE 3

Formula and performance parameters of wafer thinning tape

| Number | 3-1 | 3-2 | 3-3 | 3-4 | 3-5 |
|---|---|---|---|---|---|
| Acrylic adhesive | 100 g | 100 g | 100 g | 100 g | 100 g |
| Curing agent | | | 3 g | | |
| Antistatic agent | — | 0.5 g | 1 g | 2 g | 5 g |
| ESD TPU film | | | 100 ohm/sq | | |
| Adhesion | 350 g/25 mm | 320 g/25 mm | 280 g/25 mm | 270 g/25 mm | 230 g/25 mm |
| Surface impedance | $2 \times 10^{13}$ Ω | $3 \times 10^{11}$ Ω | $1 \times 10^{10}$ Ω | $8 \times 10^{9}$ Ω | $6 \times 10^{9}$ Ω |
| Whether there is residue | OK | OK | OK | OK | NG |
| Peeling static electricity | 2.5 kv | 0.7 kv | 0.2 kv | 0.2 kv | 0.2 kv |

Combined with Table 2 and Table 3, it can be seen that although the greater the amount of antistatic agent added, the better the effect of inhibiting the peeling static electricity, the excessive addition of antistatic agent will cause the residual precipitation of the tape layer and affect the adhesion. Therefore, trying to obtain excellent antistatic effect only by relying on antistatic agents will affect the overall performance of the tape. However, the use of a specific amount of antistatic agent, combined with ESD TPU film, can obtain an excellent peeling static electricity inhibitory effect but also take into account the overall performance of the tape. When the tape is peeled from the wafer, the antistatic agent in the tape layer will produce a certain antistatic effect and reduce static electricity generation. Coupled with the low impedance of the ESD TPU film, electrons are induced to run to the surface of the low-impedance ESD TPU film, thus producing a significant peeling static electricity inhibitory effect.

The above examples are intended only to clearly illustrate the examples made and are not intended to limit the implementations. For ordinary technical personnel in the field, other alterations or changes in different forms can be made on the basis of the above description, and it is not necessary and impossible to give an exhaustive list of all implementations, so the obvious changes or alterations that are extended are still within the scope of protection of the invention.

What is claimed is:

1. A wafer thinning tape, comprising: a tape layer, a base film layer, and a conductive coating, wherein the tape layer, the base film layer, and the conductive coating are successively stacked, the base film layer and the conductive coating constitute an antistatic base film;

raw materials of the tape layer consist of an acrylic adhesive, a curing agent, and an antistatic agent, a mass dosage of the curing agent is 3%-4% of a mass dosage of the acrylic adhesive, and a mass dosage of the antistatic agent is 1%-2% of the mass dosage of the acrylic adhesive;

the base film layer is a thermoplastic polyurethane (TPU) film;

the conductive coating is a silver nanowire coating;

the curing agent is toluene 2,4-diisocyanate;

the antistatic agent is pyridinium, alkyl-alkyl-salt with polyhalogeno-[(polyhalogenoalkyl)sulfonyl]alkanesulfonamide, wherein an impedance of the antistatic base film is equal to or less than $10^2$ ohm, and a silver nanowire used in the silver nanowire coating has a diameter of 25-300 nanometers.

2. The wafer thinning tape according to claim 1, wherein a thickness of the tape layer is 10-50 microns.

3. The wafer thinning tape according to claim 1, wherein a thickness of the base film layer is 100-500 microns.

4. The wafer thinning tape according to claim 1, wherein the silver nanowire used in the silver nanowire coating has a length of 10-300 microns.

5. The wafer thinning tape according to claim 4, wherein the silver nanowire used in the silver nanowire coating has an average diameter of 45 nanometers and an average length of 5-20 microns.

6. A preparation method for a wafer thinning tape, wherein:

the wafer thinning tape comprises: a tape layer, a base film layer, and a conductive coating, wherein the tape layer, the base film layer, and the conductive coating are successively stacked, the base film layer and the conductive coating constitute an antistatic base film;

raw materials of the tape layer consist of an acrylic adhesive, a curing agent, and an antistatic agent, a mass dosage of the curing agent is 3%-4% of a mass dosage of the acrylic adhesive, and a mass dosage of the antistatic agent is 1%-2% of the mass dosage of the acrylic adhesive;

the base film layer is a thermoplastic polyurethane (TPU) film;

the conductive coating is a silver nanowire coating;

the curing agent is toluene 2,4-diisocyanate;

the antistatic agent is pyridinium, alkyl-alkyl-, salt with polyhalogeno-[(polyhalogenoalkyl) sulfonyl]alkane-sulfonamide, wherein an impedance of the antistatic base film is equal to or less than $10^2$ ohm, and a silver nanowire used in the silver nanowire coating has a diameter of 25-300 nanometers;

the preparation method comprises:

mixing the acrylic adhesive, the curing agent, and the antistatic agent according to parts by mass to obtain a tape layer slurry;

coating the tape layer slurry on a release film, and drying to form the tape layer on the release film;

coating a silver nanowire on a first side of the base film layer, and drying to form the conductive coating on a surface of the base film layer; and affixing the tape layer to a second side of the base film layer to obtain the wafer thinning tape.

7. The preparation method according to claim 6, wherein in the wafer thinning tape, a thickness of the tape layer is 10-50 microns.

8. The preparation method according to claim 6, wherein in the wafer thinning tape, a thickness of the base film layer is 100-500 microns.

9. The preparation method according to claim 6, wherein in the wafer thinning tape, the silver nanowire used in the silver nanowire coating has a length of 10-300 microns.

10. The preparation method according to claim 9, wherein in the wafer thinning tape, the silver nanowire used in the silver nanowire coating has an average diameter of 45 nanometers and an average length of 5-20 microns.

11. A wafer grinding method comprising a wafer thinning tape, wherein:

the wafer thinning tape comprises: a tape layer, a base film layer, and a conductive coating, wherein the tape layer, the base film layer, and the conductive coating are successively stacked, the base film layer and the conductive coating constitute an antistatic base film;

raw materials of the tape layer consist of an acrylic adhesive, a curing agent, and an antistatic agent, a mass dosage of the curing agent is 3%-4% of a mass dosage of the acrylic adhesive, and a mass dosage of the antistatic agent is 1%-2% of the mass dosage of the acrylic adhesive;

the base film layer is a thermoplastic polyurethane (TPU) film;

the conductive coating is a silver nanowire coating;

the curing agent is toluene 2,4-diisocyanate;

the antistatic agent is pyridinium, alkyl-alkyl-, salt with polyhalogeno-[(polyhalogenoalkyl) sulfonyl]alkane-sulfonamide, wherein an impedance of the antistatic base film is equal to or less than $10^2$ ohm, and a silver nanowire used in the silver nanowire coating has a diameter of 25-300 nanometers;

the wafer grinding method comprises:

first affixing the tape layer of the wafer thinning tape to a non-grinding surface of a wafer, and then grinding the wafer.

12. The wafer grinding method according to claim 11, wherein in the wafer thinning tape, a thickness of the tape layer is 10-50 microns.

13. The wafer grinding method according to claim 11, wherein in the wafer thinning tape, a thickness of the base film layer is 100-500 microns.

14. The wafer grinding method according to claim 11, wherein in the wafer thinning tape, the silver nanowire used in the silver nanowire coating has a length of 10-300 microns.

15. The wafer grinding method according to claim 14, wherein in the wafer thinning tape, the silver nanowire used in the silver nanowire coating has an average diameter of 45 nanometers and an average length of 5-20 microns.

* * * * *